US011092626B2

(12) United States Patent
Vilches Millán

(10) Patent No.: US 11,092,626 B2
(45) Date of Patent: Aug. 17, 2021

(54) DEVICE FOR MEASURING ELECTRICAL VARIABLES IN ELECTRICAL PANELS

(71) Applicant: Enerclic Innovatio, S.L., Madrid (ES)

(72) Inventor: José Luis Vilches Millán, Malaga (ES)

(73) Assignee: Enerclic Innovatio, S.L., Madrid (ES)

( * ) Notice: Subject to any disclaimer, the term of this patent is extended or adjusted under 35 U.S.C. 154(b) by 0 days.

(21) Appl. No.: 16/620,211

(22) PCT Filed: Apr. 20, 2018

(86) PCT No.: PCT/ES2018/070319
§ 371 (c)(1),
(2) Date: Dec. 6, 2019

(87) PCT Pub. No.: WO2018/224709
PCT Pub. Date: Dec. 13, 2018

(65) Prior Publication Data
US 2020/0166551 A1 May 28, 2020

(30) Foreign Application Priority Data

Jun. 9, 2017 (ES) .............................. ES201730689U

(51) Int. Cl.
*G01R 19/25* (2006.01)
*G06Q 50/06* (2012.01)

(52) U.S. Cl.
CPC ......... *G01R 19/2513* (2013.01); *G06Q 50/06* (2013.01)

(58) Field of Classification Search
CPC ............ G01R 19/2513; G01R 31/3277; G01R 19/0092; G06Q 50/06; H01H 71/70; G16Z 99/00

USPC ....................................... 324/107, 76.11, 71.1
See application file for complete search history.

(56) References Cited

U.S. PATENT DOCUMENTS

| | | | |
|---|---|---|---|
| 9,413,103 B2 | 9/2016 | Pons Gonzalez | |
| 2008/0079437 A1 | 4/2008 | Robarge et al. | |
| 2011/0074382 A1 | 3/2011 | Patel | |
| 2012/0001645 A1* | 1/2012 | Javora .................. | G01R 15/142 324/658 |
| 2013/0265035 A1* | 10/2013 | Mazzarella ............ | G01R 17/16 324/123 R |

(Continued)

FOREIGN PATENT DOCUMENTS

ES 2405530 A1 5/2013

*Primary Examiner* — Giovanni Astacio-Oquendo
(74) *Attorney, Agent, or Firm* — The Webb Law Firm

(57) ABSTRACT

A device for measuring electrical variables in electrical panels may include a casing, a printed circuit board (PCB) wherein the PCB incorporates a microprocessor and an electrical current sensor; a female connector and a male connector, the female connector and the male connector being connected electrically; and a communications terminal with remote control equipment. In some non-limiting embodiments, the device may be configured to: connect a wire of the power circuit to the female connector of the casing; connect the male connector of the casing to the connection hole of protection equipment of an electrical panel; measure the amperage of the electrical current circulating through the wire, and; process and digitize the measurement of the amperage of the electrical current circulating through the wire, and transmit it, through the communications terminal, to the remote control equipment.

15 Claims, 8 Drawing Sheets

(56) References Cited

U.S. PATENT DOCUMENTS

| | | |
|---|---|---|
| 2014/0167786 A1 | 6/2014 | Gutierrez et al. |
| 2014/0184193 A1* | 7/2014 | Waugh .................... G01R 21/06 324/76.11 |
| 2020/0212677 A1* | 7/2020 | Wolkoff ................... H02J 3/003 |
| 2020/0212709 A1* | 7/2020 | de Callafon ............... H02J 3/00 |
| 2020/0284852 A1* | 9/2020 | Weingart ................ G01R 31/56 |

* cited by examiner

DEVICE FOR MEASURING ELECTRICAL VARIABLES IN ELECTRICAL PANELS

CROSS-REFERENCE TO RELATED APPLICATIONS

This application is the United States national phase of International Application No. PCT/ES2018/070319 filed Apr. 20, 2018, and claims priority to Spanish Utility Model Application No. U201730689 filed Jun. 9, 2017, the disclosures of which are hereby incorporated by reference in their entirety.

BACKGROUND

Technical Field

The present invention relates to a device for measuring electrical variables in electrical panels that is easy to install and are very versatile, for domestic and/or industrial measuring of electrical currents and/or voltages in switches and protection devices for electrical panels. The device likewise enables electrical variables and consumption statistics and network quality to be calculated starting from the measurements performed in the connection between the switches and/or protection devices for the electrical panel and the electrically-conducting power wires.

The device for measuring electrical variables in electrical panels object of the present invention has applications in the sector of the industry dedicated to the design, manufacturing, marketing and installation of electrical equipment for measuring, controlling consumption and energy efficiency.

Background Art

Measuring electrical variables in domestic and industrial installations is of vital importance, not only to maintain the safety of an electrical installation, but also to control the consumption and use of certain portions of an installation.

On an industrial and academic level, devices known as "network analyzers" are conventionally used to carry out the measurement and control of the electrical variables of an installation.

Network analyzers have the disadvantage of being very large and, generally, very expensive as well as complex to install for multiple measurements for them to be considered for the use thereof on a domestic level or in large electrical panels with multiple readings, so that families or resident communities can carry out an exhaustive and individualized control of the consumption and electrical variables that affect an installation.

SUMMARY OF THE INVENTION

With the object of providing a solution to the previously mentioned problem, the following device for measuring electrical variables in electrical panels is presented.

The device for measuring electrical variables in electrical panels object of the present invention includes a casing made of electrically insulating material (typically plastic).

Inside the casing, the device incorporates a printed circuit board or PCB. The PCB incorporates a microprocessor and an electrical current sensor.

The device incorporates a socket or female connector in the casing and a comb or male connector that projects from the casing, the female connector and the male connector being connected to each other electrically, which enables the current sensor to read the circulating electrical current.

Preferably, the male connector or comb makes up an extension of the PCB itself inside the casing, which projects outwards from the casing.

In this way, the PCB is configured/cut out with a comb-shaped geometry, which projects outwards from the casing, wherein the portion of the PCB that projects outwards from the casing makes up the male connector.

The device likewise incorporates at least one communications terminal, configured for communication with remote control/reading equipment.

With help from the previously described elements, the device for measuring electrical variables in electrical panels is configured to:

connect an electrically-conducting wire of a power circuit to the female connector of the casing;

connect the male connector of the casing to the connection hole of protection or cutting off equipment (switch or fuse box) of an electrical panel;

measure the amperage of the electrical current circulating through the power-conducting wire, and;

process and digitize the measurement of the amperage of the electrical current circulating through the power-conducting wire, and transmit it, through the communications terminal, to the remote control equipment.

According to a first embodiment, the communications terminal comprises at least one connection port, configured for the connection of a communications Channel (for example, a BUS for transmitting data). Preferably, the device incorporates at least two connection ports.

The device is likewise configured to make calculations of electrical variables based on the measurement of the electrical current amperage circulating through the power-conducting wire.

Preferably, the PCB comprises a copper insert, thus being configured to enable the circulation of large currents, typically up to 65 amperes.

The device incorporates a transceiver. Said transceiver, in those embodiments in which there is a connection port for transmitting data through a communication channel, is configured to carry out the adjustment of the parameters of the communication for the transmission of data through the communication channel. In these cases, among other functions, the transceiver is configured to adapt the voltage levels of the data transmission to suitable values for the communication channel.

However, there are embodiments in which the communications terminal comprises, alternatively to the connection port for the data transmission, or in addition to the connection port for the data transmission, any combination of: a wireless transmitter, an ultrasonic emitter, a fiber optic port, etc. In these cases, the transceiver is responsible for adapting the data signal to the specific physical transmission medium (electrical (analog/digital), optical, ultrasonic, wireless (WiFi, GPRS, etc.)) of the communications terminal, as well as the specific transmission protocol (both physical and logical).

The device includes an internal memory configured to store electrical variables, measured and/or calculated, based on the measurements made by the device.

According to a possible embodiment, the device is configured to receive electrical power for the operation thereof through a connected voltage source, by means of a power BUS, to a power port of the device. In these cases, the power port preferably makes up part of the aforementioned connection port of the device, and the power BUS makes up, together with the communication channel, part of a connection BUS configured to be connected to the connection port of the device.

Likewise, the device preferably includes a DC/DC converter to adapt the power voltage level of the BUS to the level required for the operation of the device.

According to a first variant of the device, it is made up of an individual module, configured for the connection of a single electrically-conducting wire of the power circuit.

According to a second variant of the device, it is made up of a three-phase module, configured for the connection of four electrically-conducting wires of the power circuit, wherein three of said wires correspond to three phases of a three-phase circuit, and one of said wires corresponds to the neutral of said three-phase circuit. This second variant thus comprises a male connector or quadruple comb, and a female connector or quadruple socket.

According to a third variant of the device, it is made up of a single-phase module, configured for the connection of two electrically-conducting wires of a power circuit, wherein one of said wires corresponds to a phase of a single-phase circuit, and the other of said wires corresponds to the neutral of said single-phase circuit. This third variant thus comprises a male connector or double comb, and a female connector or double socket.

Preferably, the single-phase module and the three-phase module comprise a voltage sensor for each phase, configured to take voltage measurements between phases and/or between phase and neutral.

Likewise, the three-phase module preferably comprises an AC terminal configured to be connected, by means of wiring, to an alternating current input port of a power source (as mentioned previously), and thus provide energy to said power source.

In this way, by means of the power source connected to the three-phase module, and by means of the power BUS able to transmit the (DC) power to the three-phase modules and the individual and single-phase modules, through the power ports of these modules, the device of the invention takes the energy it needs for the operation thereof from the wiring connected to the domestic and/or industrial electrical panel.

According to an embodiment of the device, the connection port is a multi-pin port. As previously mentioned, according to a possible embodiment, this connection port also incorporates the power port.

According to another possible embodiment, the device incorporates the power source in itself, that is, it is found within its own casing, for which reason the device does not need to receive power for the operation thereof through a power BUS connected to a power port, but the device itself, through the connection of the power wire connected to the female connector thereof, takes the electrical power that it needs. In these cases, the three-phase module of the device lacks an AC terminal to provide energy to the power source. However, also in these cases, there is the chance that the three-phase module and/or the single-phase module (with larger dimensions than the individual module) is/are the only one(s) that incorporate(s) the power source, such that the other modules (single-phase and/or individual) of the device receive the electrical power that they need for the operation thereof through a power BUS connected to a power port, as described previously.

Preferably, the device (the individual module as well as the single-phase module and the three-phase module) comprises fastening means for fastening the power-conducting wire to the female connector or terminal. These fastening means preferably comprise a screw for each female connection port. However, these fastening means can be alternatively carried out by means of a spring.

Preferably, the device is designed to work with at least one three-phase module, wherein each three-phase module acts as a master of at least one individual or single-phase module. In this way, the three-phase module is configured to carry out readings of the electrical variables stored in the internal memory of the at least one individual or single-phase module to which it is connected, the three-phase module obtaining, by means of the microprocessor thereof, the electrical variables read from the at least one individual or single-phase module, and the three-phase module registering in its own internal memory the variables read and processed from the at least one individual or single-phase module.

According to a preferred embodiment of the device, each male connector (both of the individual module and each of the male connectors of the single-phase and three-phase module) is approximately 11 mm long, 5 mm wide and 2.1 mm thick.

Likewise, according to a preferred embodiment, the individual module is 3.9 cm long, 1.7 cm wide and 2.2 cm deep.

Also according to a preferred embodiment, the three-phase module is 3.9 cm long, 7.2 cm wide and 2.85 cm deep.

Likewise, according to a preferred embodiment, the single-phase is 3.9 cm long, 3.6 cm wide and 2.85 cm deep.

As introduced previously, according to a possible embodiment of the device, the communications terminal comprises a wireless transmitter (WiFi, GPRS, etc.) for sending the measurements/calculations of electrical variables to the remote control equipment. It is worth noting that in the embodiments in which the device incorporates its own internal power source, and the communications terminal exclusively consists of a wireless transmitter, the device lacks a power port and data transmission port/s, for which reason, besides the power cable connected to the female connector thereof, the device does not require any other wire or BUS connected to it for the correct operation thereof.

Likewise, according to a possible embodiment, the device is configured to receive and process instructions by means of the communications terminal, in order to be able to act, whether on the protection equipment and opening/closing each protection equipment in response to an instruction received from the remote control equipment, or on any digital input equipment able to be commanded by means of a digital signal (for example, the device would be capable of receiving instructions for connecting/disconnecting different domestic or industrial equipment such as an air conditioning apparatus, a motor for a pool purifier, etc.).

The present invention also relates to a system for measuring electrical variables in electrical panels made up of several devices (single-phase or three-phase) that work together or autonomously, comprising a casing, a PCB inside the casing, the PCB incorporating a microprocessor and one or several electrical current sensors, depending on the device (three-phase or self-powered single-phase); voltage sensor per electrical phase; a female connector that hosts the current wire and a male connector that projects from the casing (wherein the male connector transmits said current and connects to an electrical element of the panel), the female connector and the male connector being connected to each other electrically, which enables the current and voltage sensors to obtain the necessary data, and a communications terminal with remote control equipment; it being able to be a physical connection by means of a wire or wirelessly. Wherein each device of the system is configured/designed to connect an electrically-connecting power wire to the female connector; connecting the male connector to the connection hole of a cutting off or protection equipment of an electrical panel; measuring the amperage of the electrical current circulating through the wire, the voltage and; processing and digitizing the electrical measurements, and transmitting them, through the communications terminal, to the remote control equipment.

The device of the invention, upon making the electrical current physically pass through the PCB, provides an accuracy of measurement that is much higher (to the order of ten times higher) than the accuracy that would be obtained by means of indirect current measurements, such as the ones performed by means of hall effect devices (e.g., current clamps).

BRIEF DESCRIPTION OF THE DRAWINGS

As part of the explanation of at least one non-limiting embodiment of the device for measuring electrical variables in electrical panels, the following figures have been included.

DETAILED DESCRIPTION

The present invention relates to, as mentioned previously, a device for measuring electrical variables in electrical panels.

Below, and without prejudice to the general nature of the invention, as described previously, at least one embodiment of the invention is described below, with help from the figures.

The device of the invention comprises a body with small dimensions, equipped with a plastic casing. Preferably, the size of the device is somewhat smaller than the size of the protection equipment (18) for the electrical panel (not shown) to which the device is coupled.

The device for measuring electrical variables in electrical panels object of the present invention is configured to be connected, in a simple manner, to any electrical panel of a domestic or industrial electrical installation. To connect the device for measuring electrical variables in electrical panels, it is enough to take out the wire (17) for conducting the electrical current of the protection equipment (18) or switch (circuit breaker, differential, etc.) or of the fuse box of the electrical panel, and insert the device for measuring electrical variables in electrical panels between said wire and said switch or fuse box.

Preferably, there are three variants of the device for measuring electrical variables in electrical panels.

Figure 1:
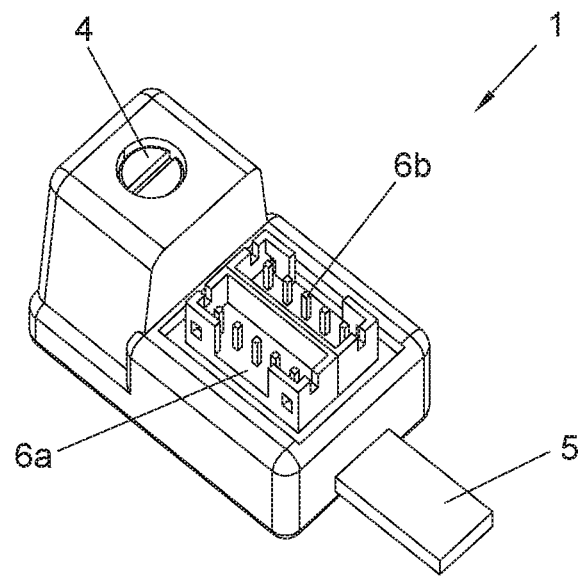
FIG. 1: shows a front schematic perspective view of the device for measuring electrical variables in electrical panels, according to the individual variant thereof.
Figure 2:
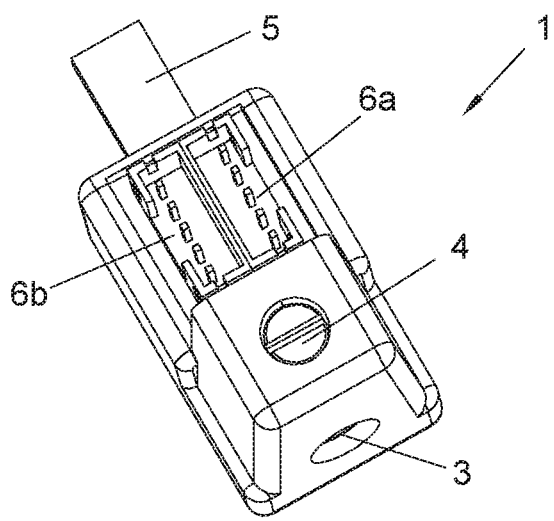
FIG. 2: shows a rear schematic perspective view of the device for measuring electrical variables in electrical panels, according to the individual variant thereof.

The first variant, or individual module (1) is shown schematically in perspective in FIG. 1 and FIG. 2.

According to a preferred embodiment, the size of the individual module (1) is (approximate measurements) 3.9 cm long, 1.7 cm wide and 2.2 cm deep.

Figure 3:
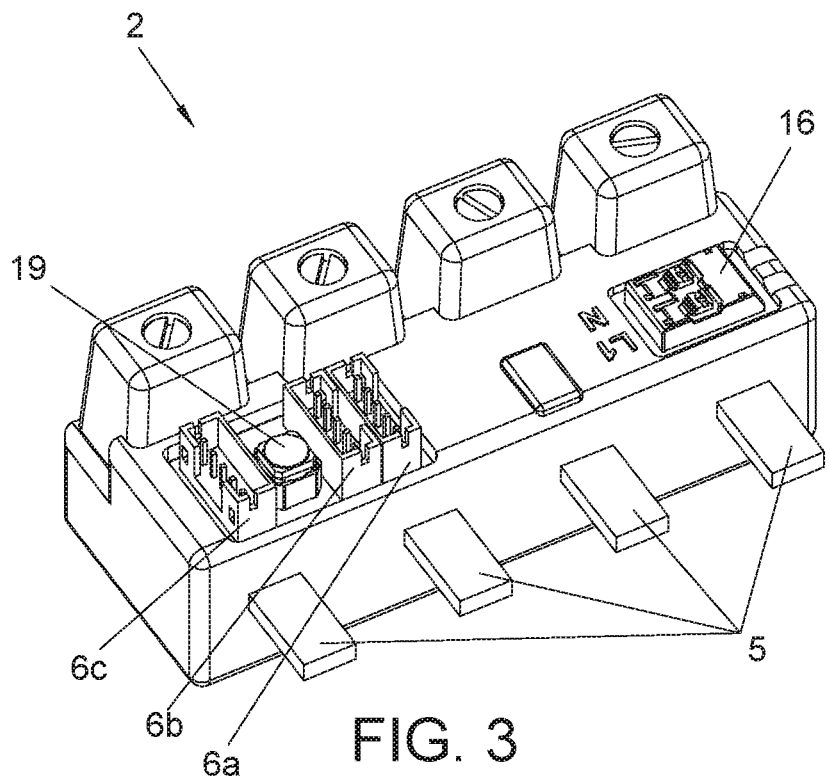
FIG. 3: shows a front schematic perspective view of the device for measuring electrical variables in electrical panels, according to the three-phase variant thereof.
Figure 4:
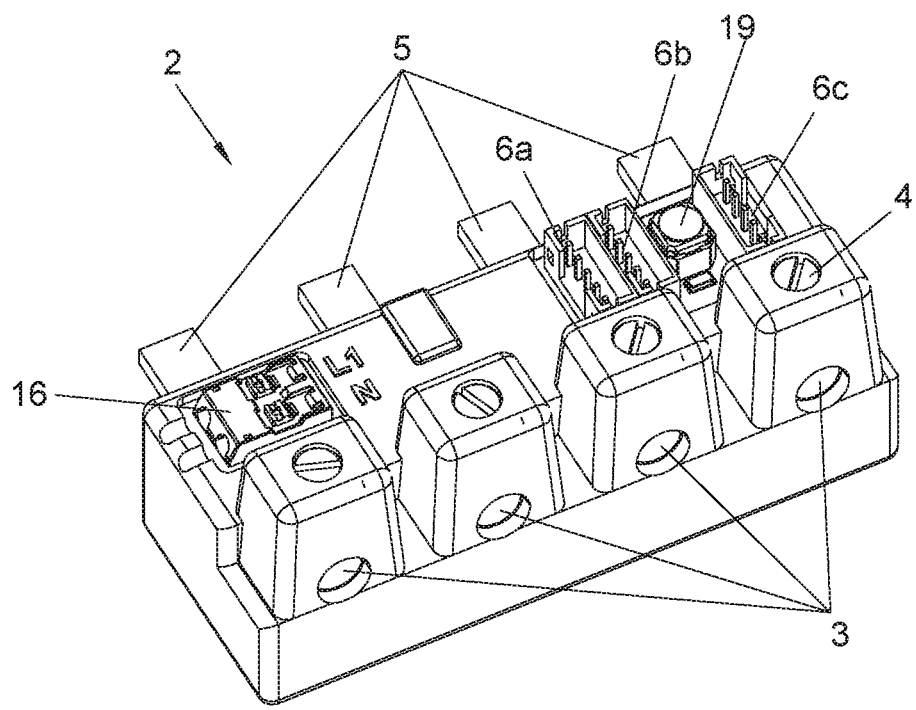
FIG. 4: shows a rear schematic perspective view of the device for measuring electrical variables in electrical panels, according to the three-phase variant thereof.

The second variant, or three-phase module (2), is shown schematically in perspective in FIG. 3 and FIG. 4.

According to a preferred embodiment, the size of the three-phase module (2) is (approximate measurements) 3.9 cm long, 7.2 cm wide and 2.85 cm deep.

Figure 5:
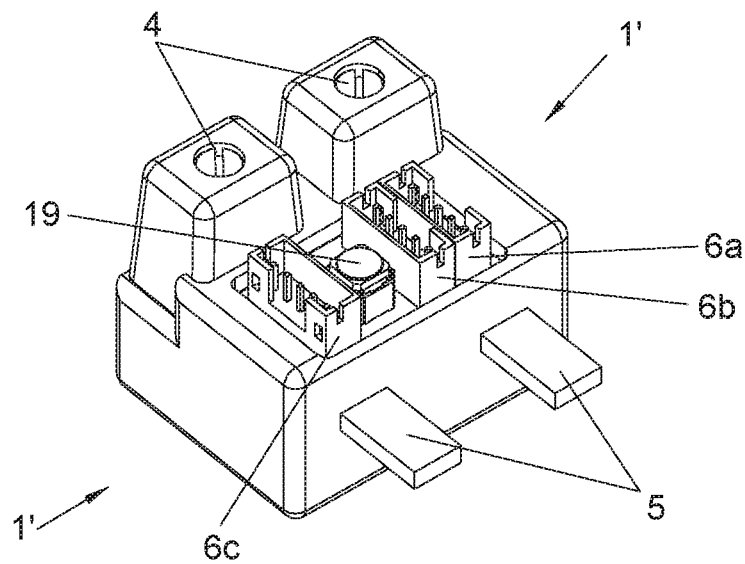
FIG. 5: shows a front schematic perspective view of the device for measuring electrical variables in electrical panels, according to the single-phase variant thereof.
Figure 6:
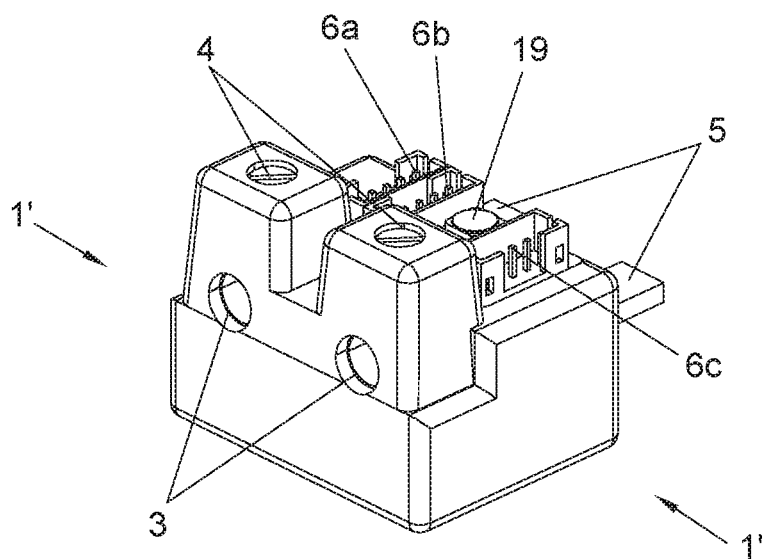
FIG. 6: shows a rear schematic perspective view of the device for measuring electrical variables in electrical panels, according to the single-phase variant thereof.

The third variant, or single-phase module (1'), is shown schematically in perspective in FIG. 5 and FIG. 6.

According to a preferred embodiment, the size of the single-phase module (1') is (approximate measurements) 3.9 cm long, 3.6 cm wide and 2.85 cm deep.

In order to install the device for measuring electrical variables in electrical panels, the wire of the corresponding switch or fuse box of the electrical panel is disconnected, and said wire is introduced by a socket or female connector (3) of the individual module (1), the single-phase module (1') or the three-phase module (2). Subsequently, the wire is fastened to the female connector (3) by means of fastening means (4) provided in the device. These fastening means (4) typically comprise a fastening screw.

Below, a "comb" or male connector (5) of the individual module (1), the single-phase module (1') or the three-phase module (2) is introduced into the corresponding connection hole of the switch or fuse box, said connection hole conventionally provided for the direct connection of the wires for conducting the electrical current. Subsequently, by means of the conventional fastening screws of the switches or fuse boxes, the male connector (5) of the device for measuring electrical variables in electrical panels is secured to said switch or fuse box.

According to a preferred embodiment of the device, the dimensions of the "comb" or male connector (5) (approximate measurements) are 11 mm long, 5 mm wide and 2.1 mm thick. These dimensions facilitate the male connector (5) being able to be comfortably and easily fit into the connection hole, with standardized dimensions, of practically all the protection equipment (18) (switches, fuse boxes, etc.) present on the market.

The three-phase module (2) comprises a quadruple comb, made up of four male connectors (5), corresponding to the three phases and the neutral of a three-phase circuit. Likewise, in a corresponding manner, the three-phase module (2) comprises four female connectors (3).

The neutral wire (17) is drawn with stripes in the figures, while the phase wires (17) are drawn in plain white.

The single-phase module (1') comprises a double comb, made up of two male connectors (5), corresponding to a phase and the neutral of a single-phase circuit with alternating current. Likewise, in a corresponding manner, the single-phase module (1') comprises two female connectors (3).

The device for measuring electrical variables in electrical panels comes equipped with at least one multi-pin connection port (6), for connecting a data communication channel (7) for sending the measured electrical variables to remote reading/control equipment (not shown), typically a computer.

According to an embodiment by way of example, the multi-pin connection port (6) comprises five pins, for connecting a communication channel (7) with five threads.

Preferably, the device for measuring electrical variables in electrical panels comprises at least two multi-pin connection ports (6a, 6b), wherein a first connection port (6a) is provided for connecting a data communication channel (7) for communicating between distinct individual modules (1), single-phase modules (1') and/or three-phase modules (2), and a second connection port (6b) is provided, for the same aim (connection between modules), or for connecting one data communication channel (7) for sending the electrical variables measured by at least one individual module (1), single-phase module (1') and/or at least one three-phase module (2), to remote reading/control equipment. Preferably, one and a further multi-pin connection port (6a, 6b) are indistinctly provided to be connected to remote control/reading equipment or to a further individual (1), single-phase (1') or three-phase (2) module of the device for measuring electrical variables in electrical panels.

In the examples shown in FIGS. 3 to 6, corresponding to the single-phase (1') and three-phase (2) modules, the device for measuring electrical variables in electrical panels comprises three multi-pin connection ports (6a, 6b, 6c). In these cases, a first multi-pin connection port (6a) is provided, either for being connected to the remote control/reading equipment, or for being connected to other modules of the same category (three-phase modules to each other and/or single-phase modules to each other); a second multi-pin connection port (6b) is provided to be connected to other modules from the same category, and; a third multi-pin connection port (6c) is provided to be connected to other modules of different categories.

As seen in FIGS. 3 to 6, the single-phase (1') and three-phase (2) modules comprise a reset button (19).

The device for measuring electrical variables in electrical panels object of the present invention internally comprises a printed circuit board (PCB) that integrates at least one current sensor (8).

Preferably, said PCB is manufactured with technology that enables said PCB to be crossed by relatively elevated current amperages, typically of up to 65 amps (A).

According to a preferred embodiment, a commercial Wirelaid® brand PCB (manufactured by the German company JUMATECH GmbH) or similar is used.

The individual module (1) internally comprises a current sensor (8), configured to measure the amperage of the electrical current that crosses said individual module (1).

According to a preferred embodiment of the invention, the single-phase module (1') and the three-phase module (2) internally comprise, for each of the phases (including the neutral), a current sensor (8) and a voltage sensor (9), respectively configured to measure the amperage of the electrical current in each of the phases and the neutral, and the voltage level between the different phases, and between the phases and the neutral.

Likewise, according to a preferred embodiment of the invention, the individual module (1), the single-phase module (1') and the three-phase module (2) comprise respective internal memories (10) for storing the electrical variables measured in each of said individual (1), single-phase (1') or three-phase (2) modules.

Likewise, the individual module (1), the single-phase module (1') and three-phase (2) module comprise respective microprocessors (11) for digitizing and processing the electrical measurements performed, for storing them in the internal memory (10), and for sending said calculated measurements and/or variables through the connection port (6) and the communication channel (7) to another individual (1), single-phase (1') or three-phase (2) module.

Furthermore, the device incorporates a transceiver (12) or media converter. As introduced previously, said transceiver (12), in those embodiments wherein there is a connection port (6) for transmitting data through a data communication channel (7), is configured to perform the adjustment of the parameters of the communication used for transmitting data through the communication channel (7). In these cases, among other functions, the transceiver (12) is configured to adjust the voltage levels of the data transmission to values that are suitable for the data communication channel (7).

According to an embodiment by way of example, a connection port (6), a BUS (7) and an RS-485 transceiver (12) are used.

Additionally, the communication channel (7) also acts as a power supply channel for the different individual (1), single-phase (1') and/or three-phase (2) modules. Each module (1, 1', 2) receives a power supply voltage in direct current (DC) from the communication channel (7) and, by means of a DC/DC converter (13) provided internally in each individual (1), single-phase (1') and three-phase (2) module, it adjusts said power source voltage to values suitable for the operation of the device.

In order to power the device for measuring electrical variables in electrical panels, an alternating current (AC) output is connected, by means of an AC terminal (16) of the three-phase module (2), to a power source (14). Said power source (14) in turn comprises a multi-pin connection port (6) for connecting the communication channel (7) that provides the power source in direct current (DC) to all the individual (1), single-phase (1') and/or three-phase (2) modules installed in the electrical panel.

Therefore, the device for measuring electrical variables in electrical panels, apart from measuring/calculating the electrical variables in an electrical panel, takes the electrical energy that it needs for the operation thereof from the electrical energy that circulates through at least one of the circuits of said electrical panel.

According to a preferred embodiment of the invention, the three-phase module (2) is configured to act as a master of the individual (1) and single-phase (1') modules, which in turn act as slaves.

However, the individual (1) and single-phase (1') modules are also configured to be able to perform the function thereof of measuring and sending electrical measurements, without intermediation from a three-phase module (2).

In the master/slave configuration, the three-phase module (2) performs a reading of the electrical variables that are measured and stored in the internal memories (10) of the individual (1) and single-phase (1') modules connected to the communication channel (7), and then the three-phase module (2) records in its own internal memory (10) the electrical variables recorded by the individual (1) and single-phase (1') modules.

The individual module (1), as well as the single-phase module (1') and the three-phase module (2) are all configured to measure electrical currents, both alternating (AC) and direct (DC).

Figure 7:
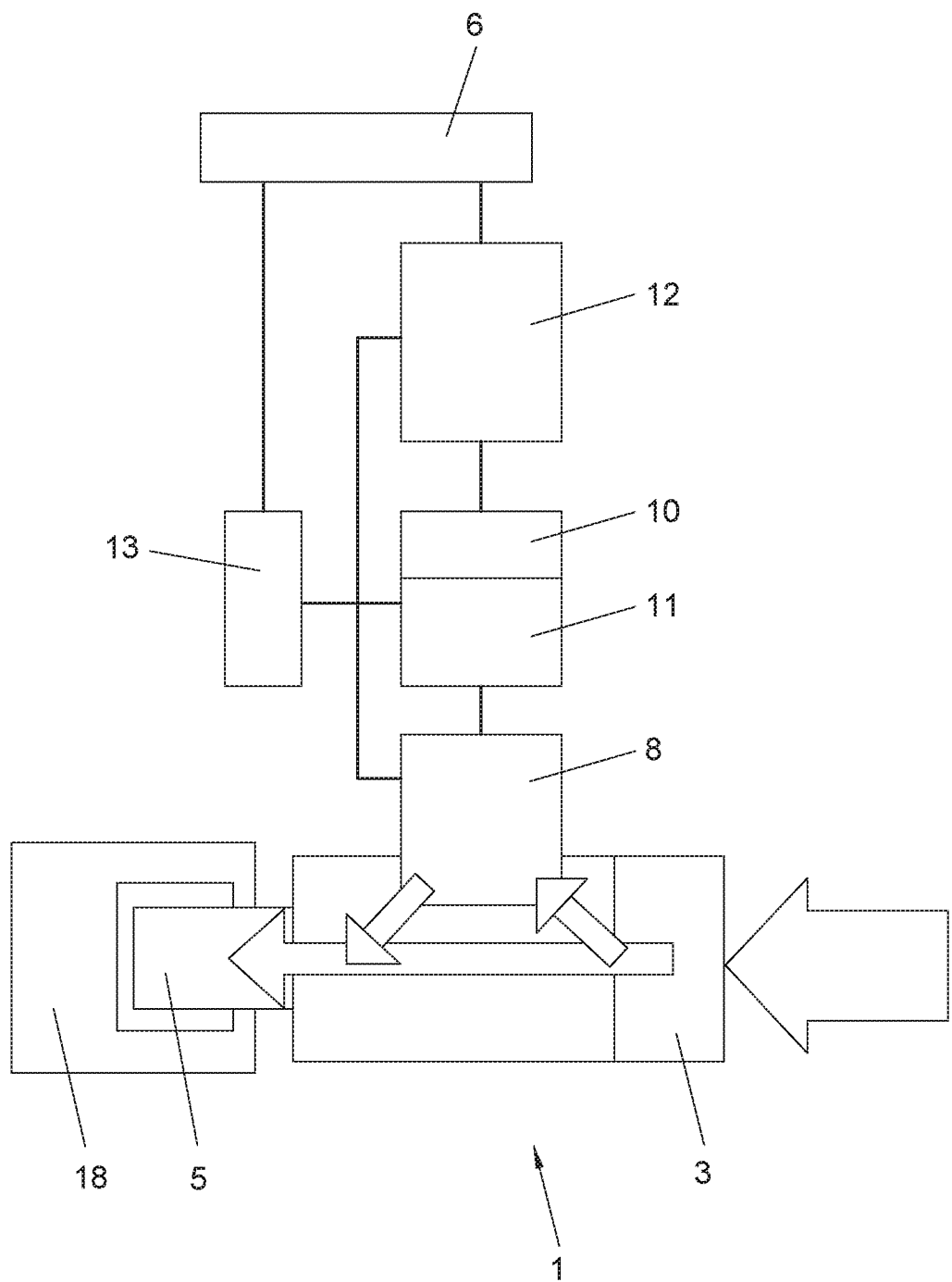
FIG. 7: shows a schematic diagram of the different internal modules of the device for measuring electrical variables in electrical panels, according to the individual variant thereof.
Figure 8:
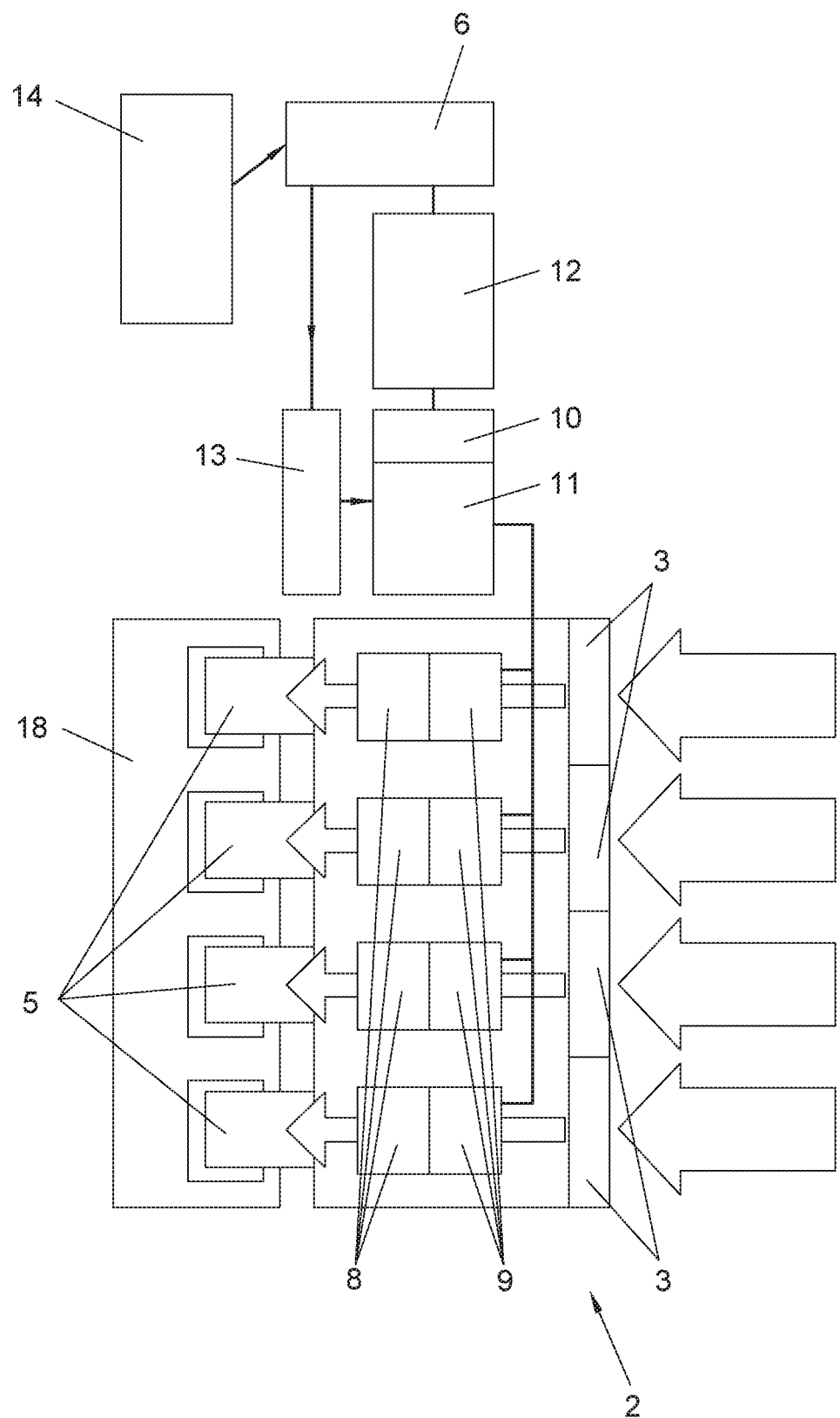
FIG. 8: shows a schematic diagram of the different internal modules of the device for measuring electrical variables in electrical panels, according to the three-phase variant thereof.

FIG. 7 and FIG. 8 show the distinct elements that make up each of the individual (1) and three-phase (2) modules of the device for measuring electrical variables in electrical panels.

Figure 9:
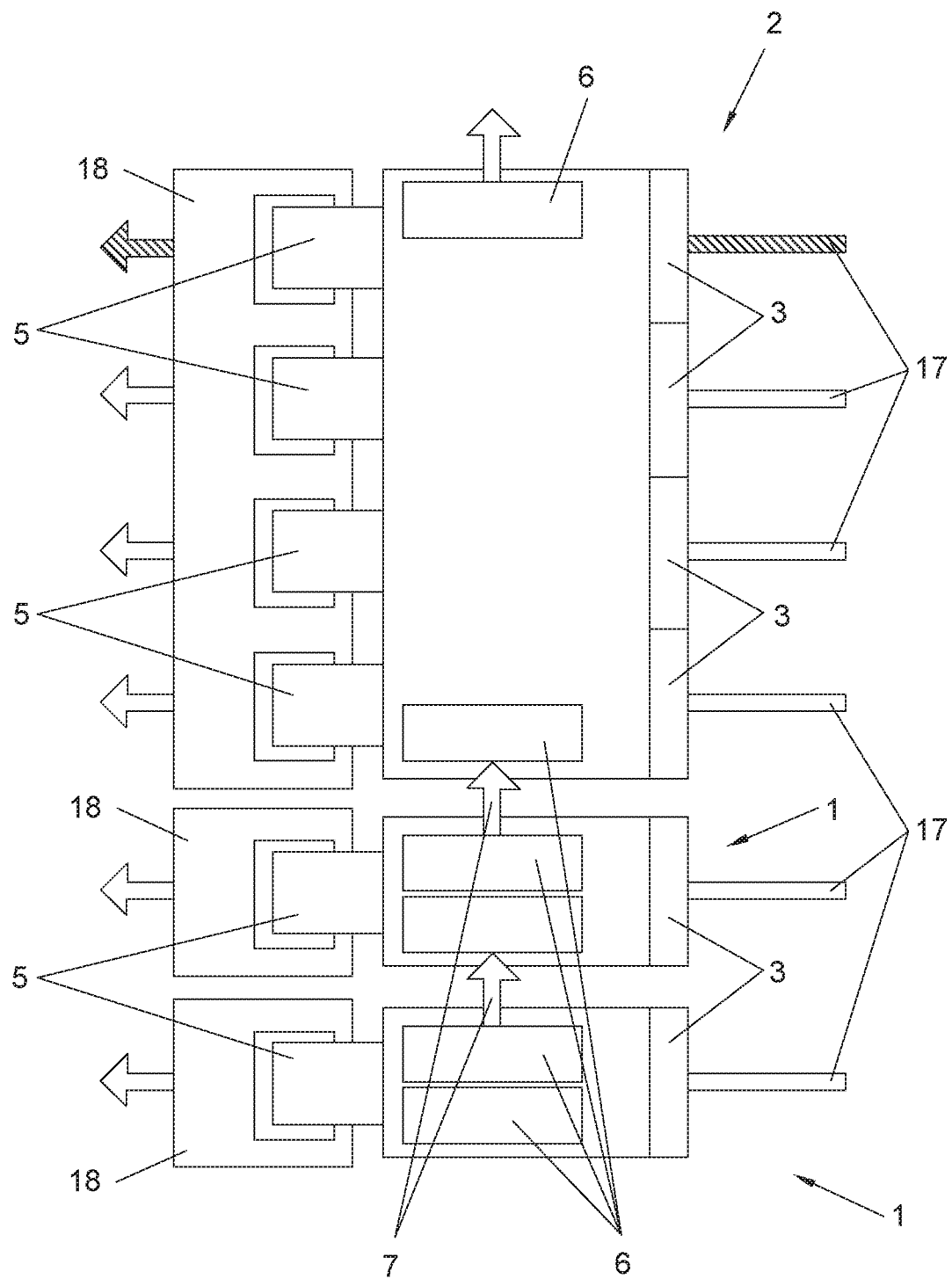
FIG. 9: shows a first configuration by way of example of the connection of the device for measuring electrical variables in electrical panels.
Figure 10:
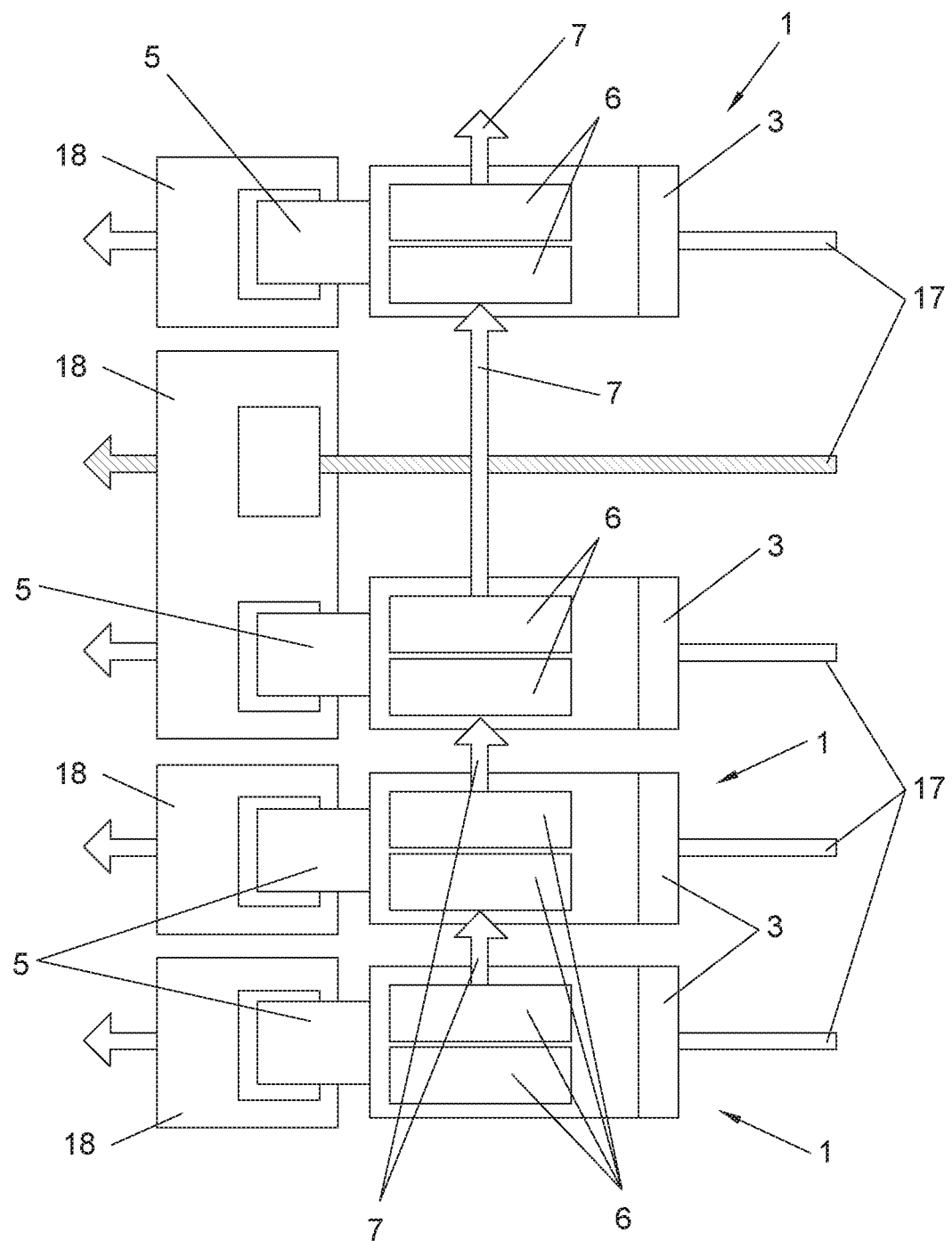
FIG. 10: shows a second configuration by way of example of the connection of the device for measuring electrical variables in electrical panels.
Figure 11:
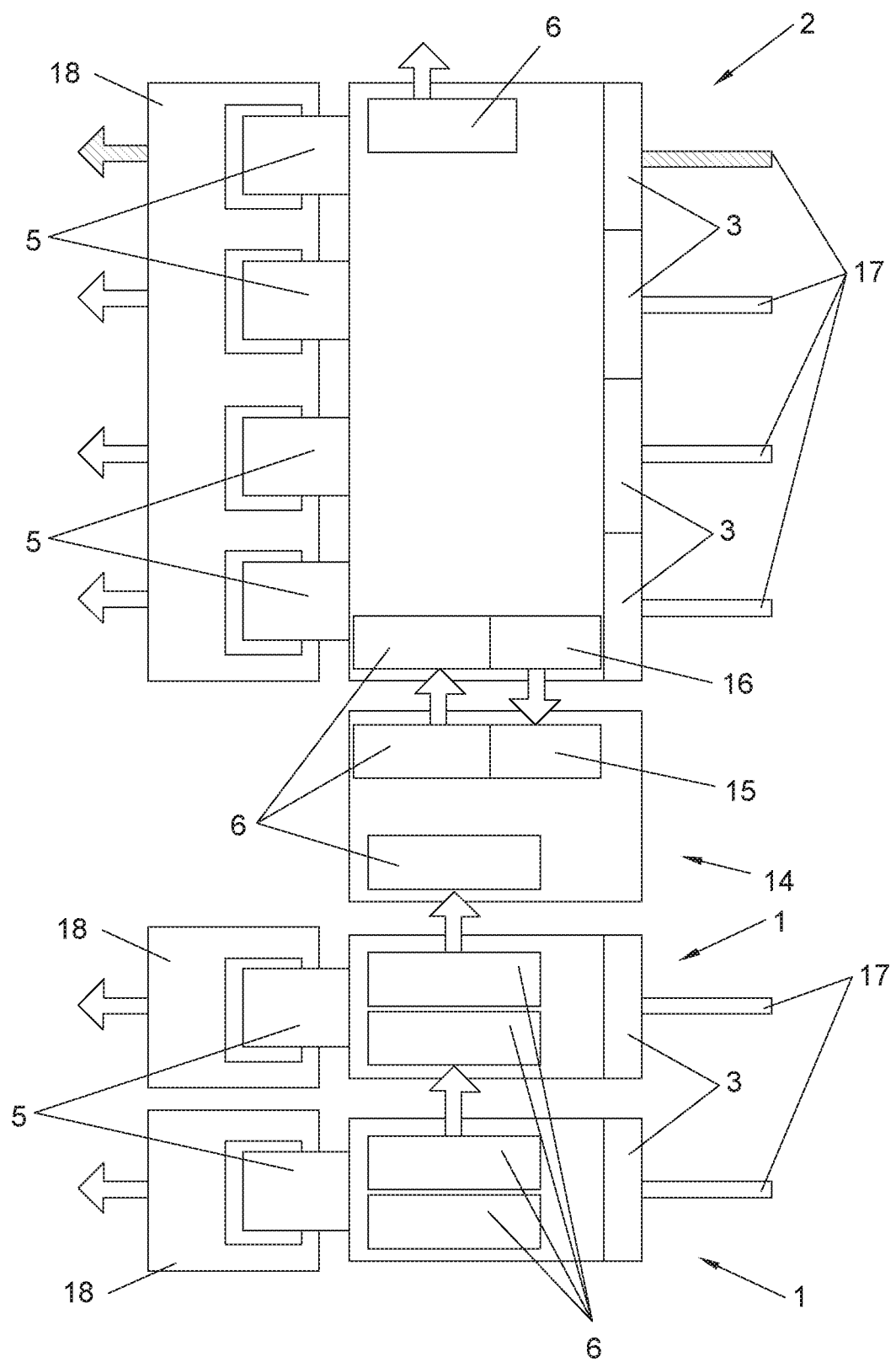
FIG. 11: shows a third configuration by way of example of the connection of the device for measuring electrical variables in electrical panels.

FIG. 9, FIG. 10 and FIG. 11 show different types of connection of the device for measuring electrical variables in electrical panels (only individual (1) and three-phase (2) modules have been represented)).

According to a first configuration shown in FIG. 9, the device enables, as mentioned previously, a three-phase module (2) to be connected, by means of a communication channel (7), to different individual (1) and single-phase (1') modules (not shown), such that the three-phase module (2) performs its own current and voltage measurements, saving them in the internal memory (10) thereof, while it performs the function of master, reading the measurements that had been previously performed by the individual (1) and single-phase (1') modules (not shown) and stored in the respective internal memories (10) thereof (in this configuration, the individual and single-phase modules (not shown) act as slave modules).

According to a second configuration, shown in FIG. 10, the individual modules act autonomously (not as slaves), performing the measurements thereof, storing them in the internal memories (10) thereof and sending them by means of a communication channel (7) to remote control/reading equipment.

Likewise, FIG. 11 shows a third configuration, similar to that of FIG. 9, but wherein the power source (14) has been detailed, forming a portion of the connection of the device for measuring electrical variables in electrical panels. According to this configuration, the power source (14), which has an alternating current (AC) input port (15), is connected to the AC terminal (16) of the three-phase module (2).

Despite the fact that in FIG. 11 the power source (14) has been shown inserted between the master (three-phase module (2)) and the slaves (individual modules (1)), the power source (14) also has the possibility of being located at the beginning of the communication channel (7), before a master.

The power source (14) delivers a DC power source voltage through a multi-pin connection port (6) to the communication channel (7) which distributes said power between the distinct individual (1), single-phase (1') (not shown) and three-phase (2) modules of the device.

Alternatively, the alternating current input port (15) of the power source can be connected to an alternative source (14), instead of connecting it to the AC terminal (16) of a three-phase module (2).

The invention claimed is:

1. A device for measuring electrical variables in electrical panels, comprising:
    a casing made of electrically-insulating material;
    a printed circuit board (PCB) inside the casing, wherein the PCB incorporates a microprocessor and an electrical current sensor;
    a female connector and a male connector in the casing, the female connector and the male connector being connected electrically; and
    a communications terminal with remote control equipment;
    wherein the device is configured to:
        connect a power circuit electrically-conducting wire to the female connector of the casing;
        connect the male connector of the casing to a connection hole of a protection equipment of an electrical panel;
        measure the amperage of the electrical current circulating through the power circuit electrically-conducting wire, and;
        process and digitize the measurement of the amperage of the electrical current circulating through the power circuit electrically-conducting wire, and transmit the measurement, through the communications terminal, to the remote control equipment.

2. The device for measuring electrical variables in electrical panels according to claim 1, wherein the communications terminal comprises at least one connection port of a data communication channel.

3. The device for measuring electrical variables in electrical panels according to claim 2, wherein the connection port is a multi-pin port.

4. The device for measuring electrical variables in electrical panels according to claim 1, wherein the PCB comprises a copper insert, and wherein the device is configured to enable the circulation of currents of up to 65 amperes.

5. The device for measuring electrical variables in electrical panels according to claim 1, wherein the device comprises an internal memory configured to store electrical variables that are measured and/or calculated based on the measurements performed by the device.

6. The device for measuring electrical variables in electrical panels according to claim 1, wherein the device comprises an internal power source.

7. The device for measuring electrical variables in electrical panels according to claim 1, wherein the device is configured to receive electrical power for the operation thereof through a power source connected, by means of a power BUS, to a power port.

8. The device for measuring electrical variables in electrical panels according to claim 7, wherein the connection port incorporates the power port, and the power BUS makes up, together with the data communication channel, part of a connection BUS, configured to be connected into the connection port.

9. The device for measuring electrical variables in electrical panels according to claim 7, wherein the device comprises a DC/DC converter for adjusting the power voltage level of the power BUS to the level required for the operation of the device.

10. The device for measuring electrical variables in electrical panels according to claim 1, wherein the device is made up of an individual module, configured for the connection of a single electrically-conducting wire of the power circuit.

11. The device for measuring electrical variables in electrical panels according to claim 1, wherein the device is made up of a three-phase module, configured for the connection of four electrically-conducting wires of the power circuit, wherein three of said wires correspond to three phases of a three-phase circuit, and one of said wires corresponds to the neutral of said three-phase circuit.

12. The device for measuring electrical variables in electrical panels according to claim 11, wherein the device comprises a voltage sensor for each phase, configured to perform voltage measurements between phases and/or between a phase and neutral.

13. The device for measuring electrical variables in electrical panels according to claim 1, wherein the device is made up of a single-phase module, configured for the connection of two electrically-conducting wires of the power circuit, wherein one of said wires corresponds to a phase of a single-phase circuit, and another of said wires corresponds to the neutral of said single-phase circuit.

14. The device for measuring electrical variables in electrical panels according to claim 13, wherein the device comprises a voltage sensor for each phase, the voltage sensor configured to perform voltage measurements between phases and/or between a phase and a neutral.

15. The device for measuring electrical variables in electrical panels according to claim 1, wherein the device comprises fastening means for fastening the wire to the female connector.

* * * * *